United States Patent
Test et al.

(10) Patent No.: US 7,265,443 B2
(45) Date of Patent: Sep. 4, 2007

(54) WIRE BONDED SEMICONDUCTOR DEVICE HAVING LOW INDUCTANCE AND NOISE

(75) Inventors: Howard R. Test, Plano, TX (US); Michael A. Lamson, Anna, TX (US)

(73) Assignee: Texas Instruments Incorporated, Dallas, TX (US)

( * ) Notice: Subject to any disclaimer, the term of this patent is extended or adjusted under 35 U.S.C. 154(b) by 126 days.

(21) Appl. No.: 11/117,878

(22) Filed: Apr. 29, 2005

(65) Prior Publication Data

US 2006/0244154 A1    Nov. 2, 2006

(51) Int. Cl.
*H01L 23/52* (2006.01)
(52) U.S. Cl. ............................... 257/691; 257/692
(58) Field of Classification Search ............ 257/666, 257/691–692, 786
See application file for complete search history.

(56) References Cited

U.S. PATENT DOCUMENTS 5,148,265 A * 9/1992 Khandros et al. .......... 257/773
5,801,074 A   9/1998 Kim et al.
5,925,925 A   7/1999 Dehaine et al.

* cited by examiner

*Primary Examiner*—Theresa Doan
(74) *Attorney, Agent, or Firm*—Yingsheng Tung; Wade James Brady, III; Frederick J. Telecky, Jr.

(57) ABSTRACT

A semiconductor device has a semiconductor chip with a periphery and an IC organized in a core portion and a peripheral portion. The IC has a top level of interconnecting metal traces (510) from the peripheral portion to the core portion; the traces are covered by an insulating overcoat (520) which has peripheral windows to expose bond pads. The circuit further has at least one level of metal lines (511) on top of the insulating overcoat; the lines lead from the chip periphery towards the chip core, wherein each line (511) is substantially parallel to one of the traces (510) underneath the insulating overcoat and vertically aligned therewith. After assembling the chip onto a leadframe with segments (504), bonding wires (502) connect the bond pads (510a) and the metal lines (511a) with the segments.

13 Claims, 4 Drawing Sheets

WIRE BONDED SEMICONDUCTOR DEVICE HAVING LOW INDUCTANCE AND NOISE

FIELD OF THE INVENTION

The present invention is related in general to the field of semiconductor devices and processes and more specifically to high performance wire bonded semiconductor devices, which can provide high speed and low noise at a cost lower than flip-chip devices.

DESCRIPTION OF THE RELATED ART

High performance semiconductor devices are often assembled using flip-chip processes based on metal reflow elements such as solder balls. Flip-chip assembly provides short, low inductance, low resistance paths for power and ground that result in lower electrical noise levels. Further, flip-chip assembly can provide high performance power and ground connections virtually anywhere on the chip. Especially important is the ability to deliver power and ground with low noise to the center of the chip, where logic and memory functions of the integrated circuit are concentrated.

Wire bonded devices, on the other hand, can theoretically not perform as well due to higher resistance and higher inductance of the wire. Since wires are practically attached only around the chip periphery, power and ground for the core process must be bussed from the periphery of the chip to the core using the thin, narrow aluminum or copper metallization that is formed during the wafer fabrication. These busses add significant resistance and inductance, resulting in larger voltage drops that are expressed in terms of power and ground noise.

While flip-chip assemble devices look technically superior, flip-chip assembled devices are more expensive than wire bonded devices. Cost/performance sensitive products cannot compete with lower performance devices. Product managers demand the higher performance of flip-chip assembled products, but they also demand the lower cost of wire-bonded devices.

SUMMARY OF THE INVENTION

Applicants recognize a need to develop a technical approach which combines the low cost advantage of wire bonded assembly with the advantage of superior technical characteristics such as minimum inductance and noise—prerequisites of high speed—delivered to the place where they are needed foremost, namely the center of the chip.

The solution is to create pairs of planar conductor structures, one ground and one power, that are on close proximity to each other using one or more thick copper conductors above the power bus with the passivation layer providing electrical isolation. The layer is applied after normal semiconductor wafer fabrication is completed.

One embodiment of the present invention is a semiconductor device comprising a semiconductor chip having a periphery and an integrated circuit organized in a core portion and a peripheral portion. The integrated circuit has a top level of interconnecting metallization traces from the peripheral portion to the core portion, the traces are covered by an insulating overcoat which has peripheral windows to expose bond pads. The circuit further has at least one level of metal lines on top of the insulating overcoat; the lines lead from the chip periphery towards the chip core, wherein each line is substantially parallel to one of the traces underneath the insulating overcoat and vertically aligned therewith. After assembling the chip onto a support with contact pads, bonding wires connect the bond pads and the metal lines with the contact pads.

The respective pairs of lines and traces are parallel and vertically aligned substantially their entire length; each pair is operable to transport electrical current from the peripheral portion of the chip to the core portion. Since the insulating overcoat between respective lines and traces has a thickness of only 0.1 to 1.0 µm, the effective inductance (and thus noise) between corresponding lines and traces is diminished. Examples for the electrical current include power and ground, and signal and ground.

In embodiments where additional insulating layers are used to separate more than one level of metal lines, their thickness is also preferably in the 0.1 to 1.0 µm range. These insulating layers and the corresponding metal lines are produced after completion of the regular front end wafer processes.

Additional reduction in inductance can be realized by providing the shortest multiple wire bonds possible by bonding from the edge of the device to the contact pad of the device substrate or leadframe. In addition, multiple wire bonds can be used in an arrangement to take advantage of coupling power to ground wires.

Technical advantages of the invention are its simplicity and low cost so that it can be easily adopted into any integrated circuit.

Another technical advantage of the invention is its universal application, especially for high speed integrated circuits.

The technical advances represented by certain embodiments of the invention will become apparent from the following description of the preferred embodiments of the invention, when considered in conjunction with the accompanying drawings and the novel features set forth in the appended claims.

DETAILED DESCRIPTION OF THE PREFERRED EMBODIMENTS

Figure 1:
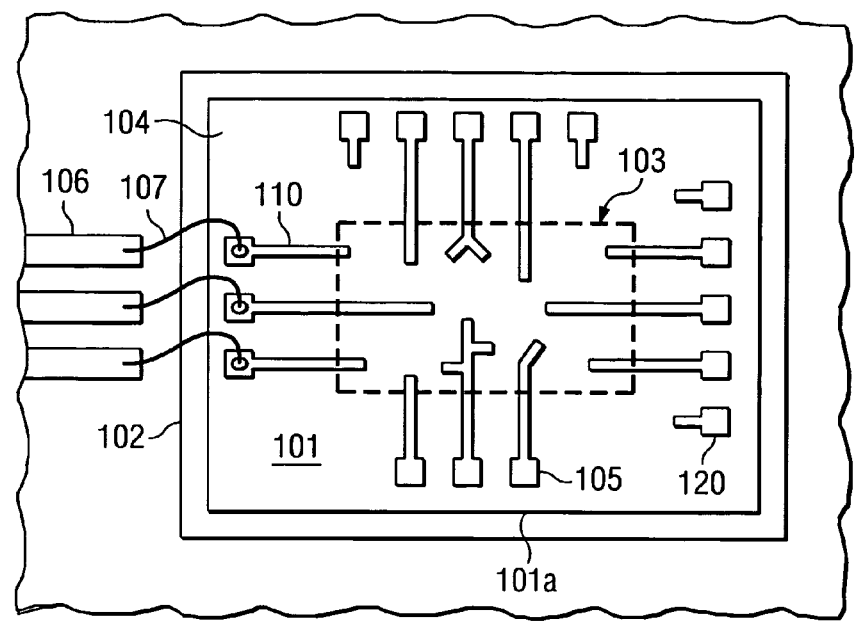
FIG. 1 depicts in a schematic top view of an integrated circuit chip mounted on a leadframe chip pad, with some bond pads wire bonded to leadframe segments.

The schematic top view of FIG. 1 illustrates a typical contemporary semiconductor integrated circuit chip 101 mounted on the chip pad 102 of a metallic leadframe. Chip 101 has a periphery 101a and is composed of two circuitry portions: 103 is the core portion which includes the majority of the logic, switches, and memory circuitry, and 104 is the peripheral portion made up mostly of the buffer and input/output circuitry. Chip 101 further has a plurality of bond pads 105, which are typically aligned along the chip periphery in order to simplify the automated wire bonding process. In FIG. 1, bond pads 105 are shown to serve the supply of power and ground, and also signals, to the core chip portion 103. Another plurality 120 of bond pads is shown to serve the buffer chip portion.

FIG. 1 further shows a plurality of leadframe segments 106; wire bonds 107 serve as interconnections between bond pads 105 and leadframe segments 106. In FIG. 1, only a few of the wire bonds are shown, all connecting to those bond pads 105a; which function as power and ground supply terminals to the core chip portion 103. Since wires 107 are typically gold wires of about 20 to 25 µm diameter, they introduce significant resistance and inductance, when they are not kept short.

For simplicity's sake, the metallic supply busses 110 from the bond pads 105 to the core chip portion 103 are shown as straight lines; in actual chip layouts, they may follow a variety of patterns and contours. As the schematic FIG. 1 indicates, the lengths of the supply busses may vary widely, determined by the location in the core circuit portion, where the power is actually needed. Since the supply busses 110 are typically made of thin, narrow aluminum or copper metallization formed during wafer fabrication, it is obvious that they add significant resistance and inductance, resulting in significant voltage drops that are expressed in terms of power and ground noise.

Figure 2:
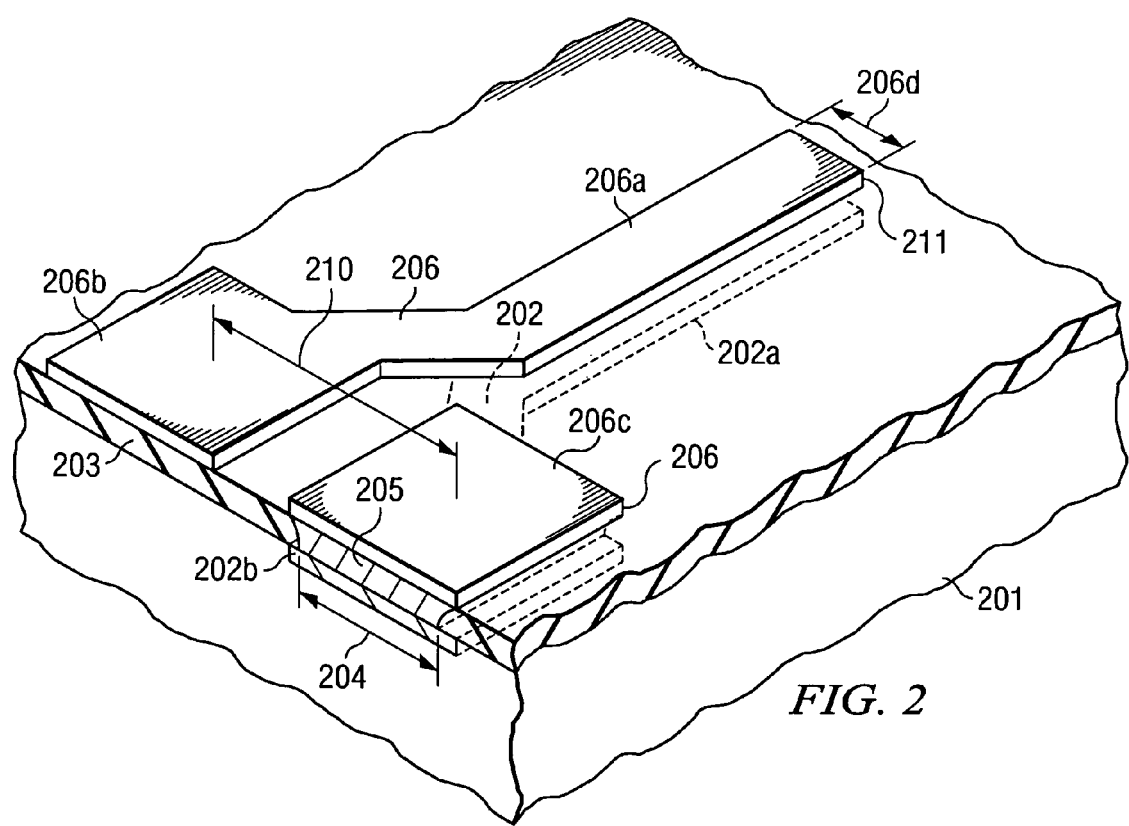
FIG. 2 is a schematic perspective view of an embodiment of the invention.

FIG. 2 illustrates schematically an embodiment of the present invention. Semiconductor chip 201, commonly fabricated into silicon or silicon germanium, has an integrated circuit (IC) roughly grouped into a core portion and a peripheral portion. The IC of chip 201 further has at least one level of interconnecting metallization; in most circuits, several vertically interconnected levels of metal would be needed. Preferred metals include aluminum or copper, or alloys thereof, in the thickness range from about 0.5 to 1.0 µm. FIG. 2 shows only the top level metal layer 202, which is patterned Into interconnecting traces. FIG. 2 shows specifically an interconnecting trace 202a; which reaches from the peripheral chip portion to the core chip portion.

The IC and the top level 202 of interconnecting metallization are covered by an insulating overcoat 203. Preferably, overcoat 203 is made of silicon nitride, silicon oxynitride, or silicon carbide in the thickness range of about 0.1 to 1.0 µm. In some devices, overcoat 203 uses polyimide or stacks of insulator layers. FIG. 2 shows a window 204 in overcoat 203, which exposes an area 202b of metallization 202 suitable as a bond pad. As a portion of top metallization 202, bond pad 202b consists preferably of aluminum or copper or alloys thereof.

The exposed bond pad is covered by plug metal 205. Dependent on the metal of bond pad 202b; plug metal 205 may include copper, nickel, cobalt, chromium, molybdenum, titanium, tungsten, and alloys thereof. Plug metal 205 is topped by pad 206c of metal layer 206, which is preferably copper in the thickness range from 1 to 5 µm. If there is no plug 205, the pad 206c of layer 206 may cover the slopes of the overcoat surrounding the window 204 and contact bond pad metal 202b directly. Since a wire ball, typically gold, will have to be attached to pad 206c, the outermost surface of pad 206c has to be bondable; consequently, it preferably consists of a thin layer of gold or palladium.

Metal layer 206 on top of the insulating overcoat 203 is patterned into lines 206a so that they run substantially parallel to one of the traces 202a underneath the insulating overcoat 203 and vertically aligned with trace 202a, preferably the entire length of trace 202a. It is preferred that width 206d of line 206a is the same as the width of trace 202a, but it may also deviate from it. Near the endpoint 211 of line 206a there is at least one metal-filled via (not shown in FIG. 2) through insulator 203 for connection to the IC underneath. Each pair of trace 202a and line 206a is thus operable to transport electrical current from the peripheral chip portion to the core chip portion; examples include power and ground, and signal and ground. Since the insulating overcoat 203 between respective lines and traces is so thin, the effective inductance (and thus noise) between corresponding line and trances is diminished.

Metal 206 terminates in an area 206b suitable as a bond pad. Preferably, bond pad 206b is as close to pad 206c (pitch 210 center-to-center) as the wire bonding rules of the automated bonder equipment allow. Since a wire ball, typically gold, will have to be attached to pad 206b, the outermost surface of pad 206b has to be bondable; consequently, it preferably consists of a thin layer of gold or palladium.

Figure 3:
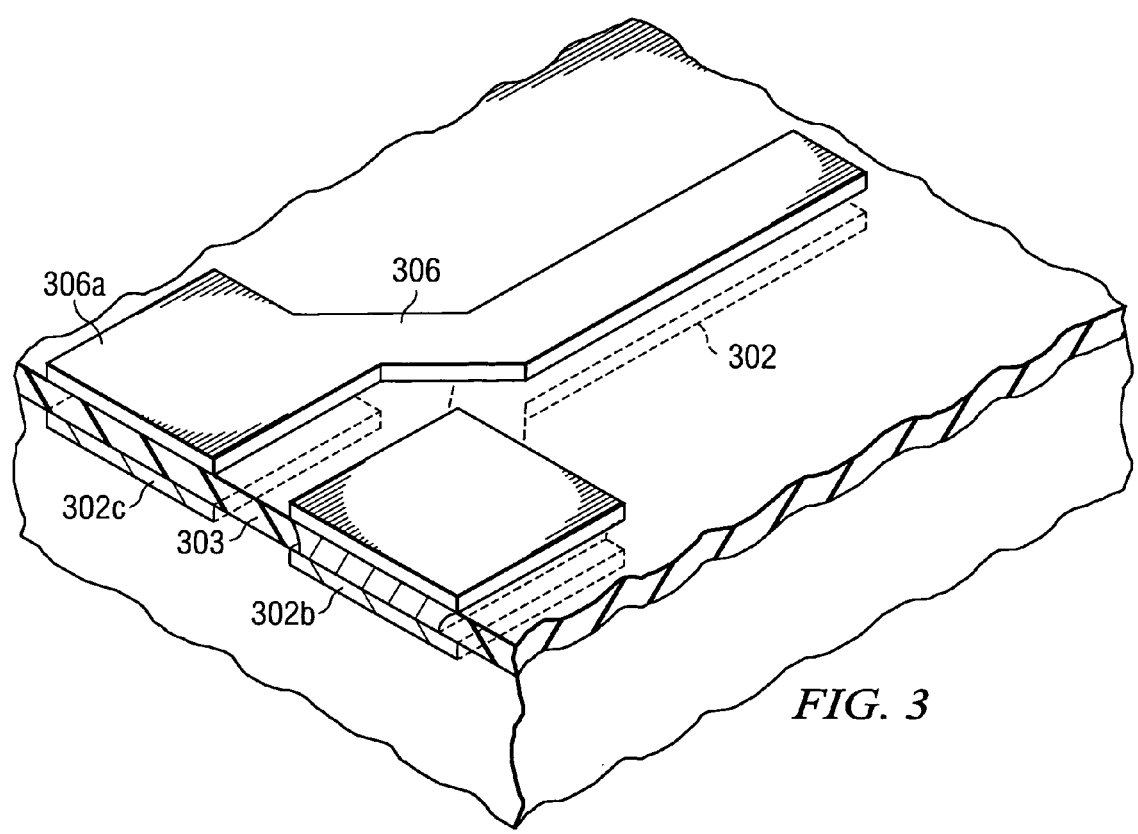
FIG. 3 is a schematic perspective view of another embodiment of the invention.

FIG. 3 depicts an embodiment of the invention closely related to the one discussed in FIG. 2. Metal layer 306 (for instance, copper) above the overcoat 303 is considerably thicker than the top metal layer 302 of the IC metallization, reducing the electrical resistance of power transportation even further. The preferred thickness of layer 306 is in the range from about 20 to 90 µm. In addition, there is an area 302c of metallization 302 directly under the bond pad 306a; the size area 302c is similar to the size of bond pad area 302b.

Figure 4:
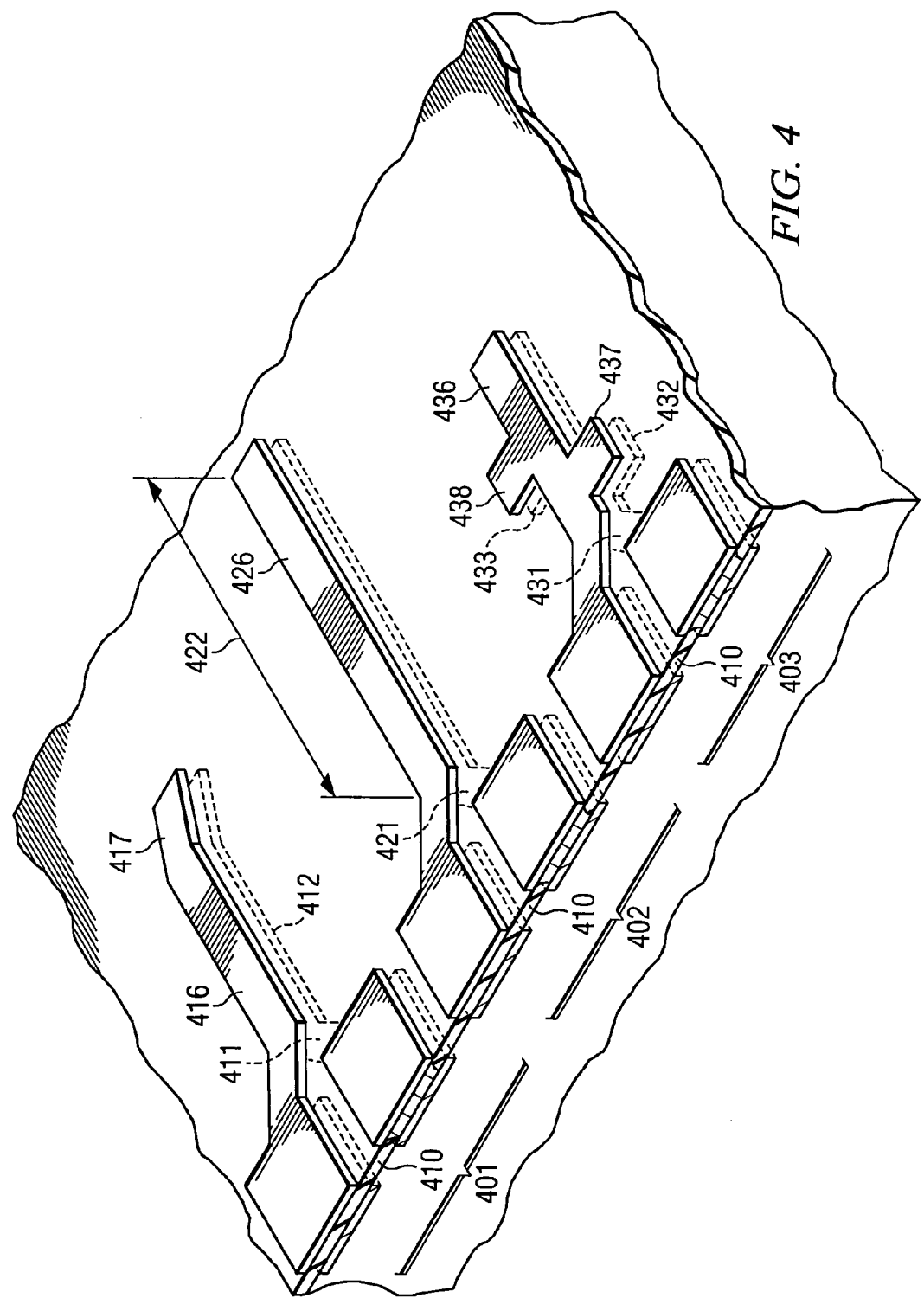
FIG. 4 shows a schematic perspective view of a portion of the chip periphery with a plurality of power and ground connections based on the invention.

In the schematic perspective view of the embodiment in FIG. 4, a plurality of planar conductive pair structures 401, 402, and 403 are illustrated, which emphasize the flexibility of the invention to connect for instance power and ground from the peripheral portion to the core portion of an IC. In all examples, the IC passivating overcoat 410 provides the electrical isolation between the conductors, and a metal-filled via traverses the overcoat at the endpoints of the pairs (not shown in FIG. 4).

In structure 401, trace 411 of the top IC metallization has a need, imposed by the circuit layout, to form at least one bending 412 in order to get power to the designated spot of the core IC portion. The metal line 416 above overcoat 410 is parallel and vertically aligned with trace 411 substantially the entire contour including the at least one bending at 417.

In structure 402, trace 421 of the top IC metallization has a need, imposed by the circuit layout, to stretch for the length 422 in order to get power from the peripheral IC portion to the core IC portion. Length 422 may have values from about 100 µm to about 4000 µm. The metal line 426 above overcoat 410 is parallel and vertically aligned with trace 422 substantially for the entire length.

In structure 403, trace 431 of the top IC metallization is designed to serve power to additional IC places with traces 432, 433 on the way to the core portion. The metal line 436 above overcoat 410 is parallel and vertically aligned substantially with the complete side-lines 437 and 438. At each side-line endpoint is a conductive via through overcoat 410 (not shown in FIG. 4).

Another feature illustrating the flexibility of the invention includes additional passivation layers, which are applied after completing normal semiconductor wafer fabrication, and additional metal layer on top of these passivation layers. These additional metal layers are patterned into lines which are substantially parallel to one of the traces underneath the passivation layer and vertically aligned therewith. The additional insulating layers have a thickness preferably in the 0.1 to 1.0 µm range.

While it is preferred that corresponding lines and traces have equal widths (see 206d in FIG. 2), it is another feature illustrating the flexibility of the invention that the corresponding lines and traces may have unequal widths. In the latter case, the width of the line is often larger than the width of the trace.

Figure 5:
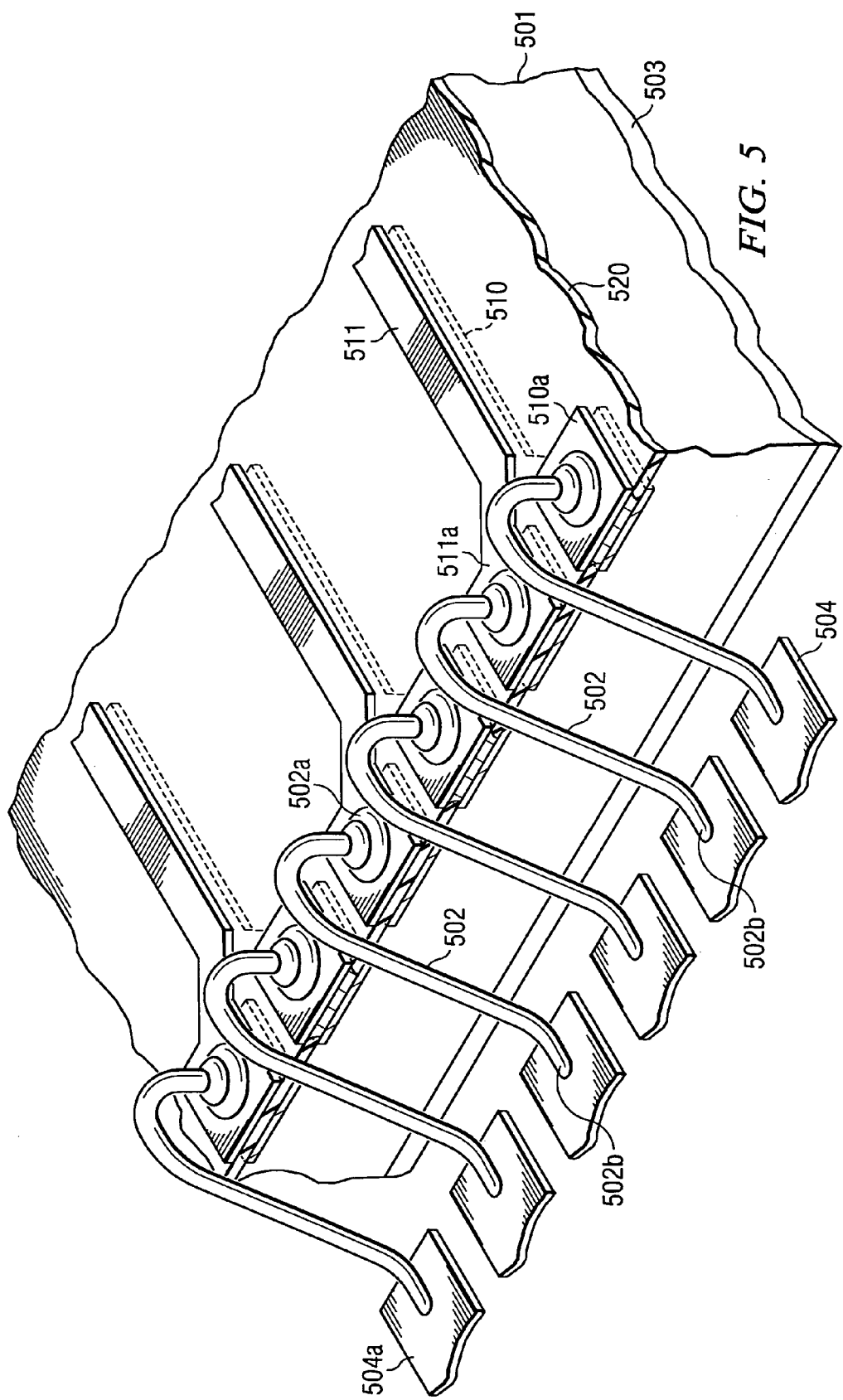
FIG. 5 illustrates a portion of a chip assembled on a leadframe with wire bonding, the chip exhibiting features according to the invention.

FIG. 5 illustrates the assembly of the chip 501 to achieve additional reduction in inductance of a coordinated pair of trace 510 and line 511 by providing short multiple wire bonds 502. In FIG. 5, a device is displayed, which employs a leadframe for assembly; chip 501 is attached to chip mount pad 503. The balls 502a of the bonds are attached to the bond pads 510a and 511a, respectively. The wire stitches 502b are attached to the ends 504a of the respective leadframe segments 504 near the chip pad. It is preferred that the wire loops are kept as short as possible. In other devices, chip 501 is attached to a substrate and the wires span the space between the bond pads and the substrate contact pads. Again, it is preferred to keep the wire loops as short as possible. In some devices, the bond pads are designed so that many such wire bonds can be used in an arrangement that takes advantage of coupling power to ground wires.

Using wire bonding and the installed automated bonder equipments permits the device assembly to operate at lower cost than flip-chip assembly, while taking full advantage of the higher performance than traditionally wire bonded devices by the low inductance, low noise access of the core portions of an IC.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

We claim:

1. A semiconductor device comprising:
   a semiconductor chip having a periphery and an integrated circuit organized in a core portion and a peripheral portion;
   said integrated circuit having a top level of interconnecting metallization traces from said peripheral portion to said core portion, said traces covered by an insulating overcoat having peripheral windows to expose bond pads; and
   at least one level of metal lines on top of said insulating overcoat, said lines leading from said chip periphery towards said chip core, each line being substantially parallel to one of said traces underneath said insulating overcoat and vertically aligned therewith.

2. The device according to claim 1 further comprising:
   a support having a location for mounting said chip, said location surrounded by plurality of support contact pads; and
   bonding wires connecting said chip bond pads and metal lines with said support contact pads.

3. The device according to claim 1 wherein said levels of metal lines are separated by layers of insulators.

4. The device according to claim 1 wherein respective pairs of lines and traces are parallel and vertically aligned substantially their entire length so that each pair is operable to transport electrical current from said peripheral portion to said core portion at diminished effective inductance and noise.

5. The device according to claim 1 wherein said support is a leadframe, said location for chip mounting is a chip pad, and said contact pads are the ends of the leadframe segments near said chip pad.

6. The device according to claim 1 wherein said support is a substrate and said contact pads tie to the interconnecting metallization of said substrate.

7. The device according to claim 1 wherein said insulating overcoat has a thickness between about 0.1 to 1.0 μm.

8. The device according to claim 3 wherein said insulator layers include silicon nitride, silicon oxynitride, silicon carbide, polyimide, and related insulators in the thickness range from about 0.1 to 1.0 μm.

9. The device according to claim 1 wherein said electrical current comprises power and ground.

10. The device according to claim 1 wherein said electrical current comprises signals and ground.

11. The device according to claim 1 wherein said core portion contains primarily the logic and memory functions of said circuit, and said peripheral portion primarily the buffer functions.

12. The device according to claim 1 wherein corresponding lines and traces have equal widths.

13. The device according to claim 1 wherein corresponding lines and traces have unequal widths.

* * * * *